United States Patent
Wang et al.

(10) Patent No.: US 10,056,867 B2
(45) Date of Patent: Aug. 21, 2018

(54) SENSOR CONTROL CIRCUIT AND ELECTRONIC APPARATUS

(71) Applicant: CSMC TECHONLOGIES FAB1 CO., LTD., Jiangsu (CN)

(72) Inventors: Xueyan Wang, Jiangsu (CN); Weiyan Zhang, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 193 days.

(21) Appl. No.: 15/022,674

(22) PCT Filed: Dec. 1, 2014

(86) PCT No.: PCT/CN2014/092723
§ 371 (c)(1),
(2) Date: Mar. 17, 2016

(87) PCT Pub. No.: WO2015/081828
PCT Pub. Date: Jun. 11, 2015

(65) Prior Publication Data
US 2016/0233840 A1    Aug. 11, 2016

(30) Foreign Application Priority Data
Dec. 4, 2013 (CN) .......................... 2013 1 0647877

(51) Int. Cl.
*H03F 3/00* (2006.01)
*H03F 3/387* (2006.01)
(Continued)

(52) U.S. Cl.
CPC .......... *H03F 3/005* (2013.01); *G01P 15/0802* (2013.01); *G01P 15/123* (2013.01);
(Continued)

(58) Field of Classification Search
CPC . H03F 3/005; H03F 3/00; H03F 3/387; H03F 3/45; H03F 3/45071;
(Continued)

(56) References Cited

U.S. PATENT DOCUMENTS 3,288,160 A * 11/1966 Eggenberger ........... F01D 17/24
137/48
5,739,720 A * 4/1998 Lee ...................... G11C 27/026
330/51
(Continued)

FOREIGN PATENT DOCUMENTS

CN            2733325 Y       10/2005
CN          201142110 Y       10/2008
(Continued)

OTHER PUBLICATIONS

Luan et al. (English Translation of Chinese Patent Application Publication CN 102213603 A).*
(Continued)

*Primary Examiner* — Harshad R Patel
(74) *Attorney, Agent, or Firm* — Polsinelli PC

(57) ABSTRACT

A sensor control circuit comprises a sensor (201), a filtering circuit (202), a buffering circuit (203), and an amplifying circuit (204). An output end of the sensor (201) is connected to an input end of the filtering circuit (202), an output end of the filtering circuit (202) is connected to an input end of the buffering circuit (203), and an output end of the buffering circuit (203) is connected to an input end of the amplifying circuit (204). Because the buffering circuit (203) is disposed between the filtering circuit (202) and the amplifying circuit (204), the sensor circuit has an advantage of full sampling. Further provided is an electronic apparatus using the sensor control circuit.

16 Claims, 6 Drawing Sheets

(51) Int. Cl.
*H03F 3/45* (2006.01)
*H03H 7/075* (2006.01)
*G01P 15/08* (2006.01)
*G01P 15/12* (2006.01)
*H03G 1/00* (2006.01)

(52) U.S. Cl.
CPC ......... *H03F 3/387* (2013.01); *H03F 3/45475* (2013.01); *H03G 1/0094* (2013.01); *H03H 7/075* (2013.01); *H03F 2200/165* (2013.01); *H03F 2200/261* (2013.01); *H03F 2200/264* (2013.01); *H03F 2203/45138* (2013.01); *H03F 2203/45514* (2013.01)

(58) Field of Classification Search
CPC ........... H03F 3/45475; H03F 2200/165; H03F 2200/168; H03F 2200/171; H03F 2200/261; H03F 2200/264; H03F 2203/45138; H03F 2203/45514; G01P 15/08; G01P 15/0802; G01P 15/123; H03G 1/00; H03G 1/0005; H03G 1/0094; H03H 7/00; H03H 7/0138; H03H 7/0153; H03H 7/0161; H03H 7/0169; H03H 7/075
See application file for complete search history.

(56) References Cited

U.S. PATENT DOCUMENTS

| | | | | |
|---|---|---|---|---|
| 6,651,499 | B2* | 11/2003 | Fell | G01C 19/567 73/504.12 |
| 9,201,091 | B2* | 12/2015 | Malvern | G01P 15/125 |
| 2003/0189461 | A1 | 10/2003 | Huijsing et al. | |
| 2004/0182157 | A1* | 9/2004 | Sakai | G01P 15/125 73/514.32 |
| 2005/0081632 | A1* | 4/2005 | Malvern | G01P 15/0802 73/514.12 |
| 2006/0112765 | A1* | 6/2006 | Malvern | G01P 1/006 73/514.32 |
| 2006/0123908 | A1* | 6/2006 | Ito | G01C 19/56 73/514.32 |
| 2008/0004536 | A1 | 1/2008 | Baxi et al. | |
| 2008/0136627 | A1* | 6/2008 | Hayakawa | B60R 21/0132 340/540 |
| 2008/0266740 | A1* | 10/2008 | Smith | H02J 1/10 361/91.5 |
| 2009/0095080 | A1* | 4/2009 | Sasaki | G01D 5/24 73/514.32 |
| 2012/0116707 | A1* | 5/2012 | Malvern | G01P 15/125 702/104 |

FOREIGN PATENT DOCUMENTS

| | | |
|---|---|---|
| CN | 102213603 A | 10/2011 |
| JP | 08-051328 | 2/1996 |
| JP | H08-51328 A | 2/1996 |
| JP | 58-96203 B2 | 3/2016 |

OTHER PUBLICATIONS

Takumi (English Translation of Japanese Patent Application Publication JP 08 051328 A).*
International Search Report, PCT/CN2014/092723.
Office Action dated Dec. 2, 2016 issued in the corresponding Chinese Application No. 201310647877.5.
Office Action dated Feb. 20, 2017 issued in corresponding Japanese Patent Application No. 2016-537125.
Supplementary European Search Report dated Mar. 23, 2017 issued in European Patent Application No. 14868241.2.

* cited by examiner

SENSOR CONTROL CIRCUIT AND ELECTRONIC APPARATUS

CROSS REFERENCE TO RELATED APPLICATIONS

This application is a national stage application (under 35 U.S.C. § 371) of PCT/CN2014/092723, filed Dec. 1, 2014, which claims benefit of Chinese Application No. CN 201310647877.5, filed Dec. 4, 2013; the contents of which are incorporated herein by reference in their entireties.

FIELD OF THE INVENTION

The invention relates to sensor technologies, and more particularly, relates to a sensor control circuit and an electronic device.

BACKGROUND OF THE INVENTION

As the development of the MEMS (Micro-electromechanical system) technology, the piezo-resistive acceleration sensor is extensively applied to many fields, due to a high sensitivity, a fast response, and a low electromagnetic interference. In general, an output of the sensor is a relative low voltage signal, because the signal is low, the signal of the sensor is easily submerged by noise and cannot be recovered. Even the signal is amplified first, but the amplifier generates noise itself and such noise is amplified, such that the SNR (signal to noise ratio) of the amplified signal is also not improved. For the low frequency noise in the signal outputted by the sensor, it is generally removed by adopting a passive RC low-pass filter to filter.

A schematic view of a control circuit of the acceleration sensor is shown as FIG. 1, the control circuit includes an acceleration sensor 101, an anti-aliasing filter 102, and an amplifier 103. The control circuit of the acceleration sensor is also known as an acceleration sensor analog front end which acquires an acceleration signal by the acceleration sensor 101, and the signal outputted by the acceleration sensor 101 is filtered and amplified by the anti-aliasing filter 102, and the acceleration signal is amplified by the amplifier 103 and configured for subsequent operations. The acceleration sensor 101 can be a piezo-resistive acceleration sensor. The model of the piezo-resistive acceleration sensor is represented as one resistor bridge, as shown in FIG. 1. A continuous passive RC filter circuit is generally adopted to accomplish the anti-aliasing filter 102. Generally, the amplifier 103 is a proportional amplifier circuit, the gain of the proportional amplifier circuit is determined by a ratio of the output feedback resistance to the input feedback resistance. In FIG. 1, Vsig represents the signal input end of the acceleration sensor 101, K represents the magnification time of the amplifier 103.

For a continuous passive RC filter circuit, in order to realize a relative low bandwidth, it requires a relative large resistance and capacitance, thus usually leading to a large area of the circuit (chip). At the same time, the sensor is in a working state all the time which causes great power consumption. Because the signal amplitude is relative low, it demands a high requirement for the noise and linearity of the drive circuit, it is difficult to design. The continuous active filter circuit requires using an amplifier, it consumes a large amount of current, and because the non-linearity of the amplifier itself, it causes a signal distortion, therefore, it demands a high requirement for designing the amplifier, increasing a designing difficulty. When the signal through the filter circuit pass through the amplifier circuit, both the traditional resistance proportional amplifier circuit and the switched capacitance proportional amplifier circuit will amplify the noise signal at the time of amplifying the signal, especially for the low frequency noise (1/f noise) of the amplifier itself, therefore, the SNR of the amplified signal decreases, causing the subsequent signal recovering to be more difficult. Further, the passive RC filter circuit does not have a driving capability itself, thus further causing a non-sufficient sampling of the post-stage amplifier circuit.

Therefore, the common used sensor control circuit has problems such as non-sufficient sampling, circuit having a large area, great power consumption and weak noise suppression capability.

SUMMARY OF THE INVENTION

Accordingly, it is necessary to provide a sensor control circuit and an electronic device having the sensor control circuit.

A sensor control circuit includes a sensor, a filter circuit, a buffer circuit; and an amplifier circuit, wherein an output end of the sensor is connected to an input end of the filter circuit, an output end of the filter circuit is connected to an input end of the buffer circuit, and an output end of the buffer circuit is connected to an input end of the amplifier circuit.

Optionally, the sensor control circuit further includes a pulse modulation switch configured to control the sensor and the filter circuit to work intermittently.

Optionally, the filter circuit is an anti-aliasing low frequency filter.

Optionally, the buffer circuit is a differential buffer circuit with offset compensation, the buffer circuit includes a first amplifier and a second amplifier, the first amplifier and the second amplifier are respectively connected in a form of a negative feedback.

Optionally, the sensor control circuit further includes a first capacitance connected between a negative input end of the first amplifier and an output end of the first amplifier, and a second capacitance connected between a negative input end of the second amplifier and an output end of the second amplifier, wherein the first capacitance and the second capacitance form an auto-zero structure.

Optionally, the buffer circuit has high input impedance and low output impedance.

Optionally, the amplifier circuit is a gain controllable switched capacitor integrator circuit.

Optionally, the switched capacitor integrator circuit includes a main amplifier, a chopper circuit connected between an input end of the switched capacitor integrator circuit and an input end of the main amplifier, and/or a sampling capacitance connected between an input end of the main amplifier and an output end of the main amplifier, wherein the chopper circuit is configured to reduce a low frequency noise and an input offset voltage of the input end of the main amplifier; and the sampling capacitance forms an auto-zero structure to reduce the input offset voltage of the input end of the main amplifier.

Optionally, the sensor is an acceleration sensor.

An electronic device includes above described sensor control circuit.

By virtue of providing the buffer circuit between the filter circuit and the amplifier circuit, the driving capability can be enhanced at some extent, thus ensuring a full sampling of the signal which is outputted by the filter circuit by the post-stage amplifier circuit.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following.

DETAILED DESCRIPTION OF THE EMBODIMENTS

In the following description, numerous specific details are set forth in order to provide a more thorough understanding of the present invention. However, it will be apparent to one skilled in the art that the present invention may be practiced without necessarily being limited to one or more of these specific details. In other instances, well-known technical features are not specific described, rather than in detail, in order to avoid obscuring the present invention.

This invention may, however, be embodied in many different forms and should not be constructed as limited to the embodiments set forth herein; rather, these embodiments are provided so that this disclosure will be thorough and complete, and will fully convey the scope of the invention to those skilled in the art. Like numbers refers to like elements throughout the accompanying drawings.

Terminology used herein merely describes the specific embodiments, and is not intended to limit the invention. When use, the singular form words "an", "one" and "the/said" are also intended to include a plural form, unless they are clearly pointed out in the context. It also should be known that when the terminology "consist" and/or "include" is used in the description, the existing of the feature, integer, step, operation, element, and/or component is determined, but the existing or adding of any other feature, integer, step, operation, element, component and/or group are not excluded. The terminology "and/or" used herein includes any or all of the combination of listed related items.

In order to fully understand the invention, the specific steps and specific structures will be provided in the following description for illustrating the technical solution of the invention. The preferred embodiment of the invention is specifically described as follows. However, the invention may be practiced without necessarily being limited to these specific details.

Figure 1:
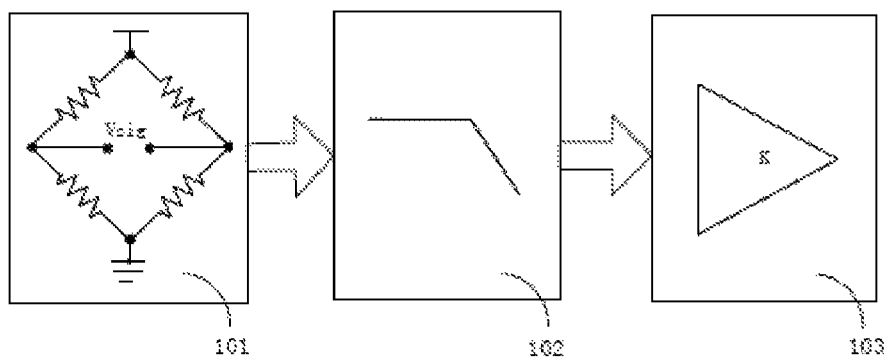
FIG. 1 is a schematic block diagram of a conventional acceleration sensor control circuit.
Figure 2:
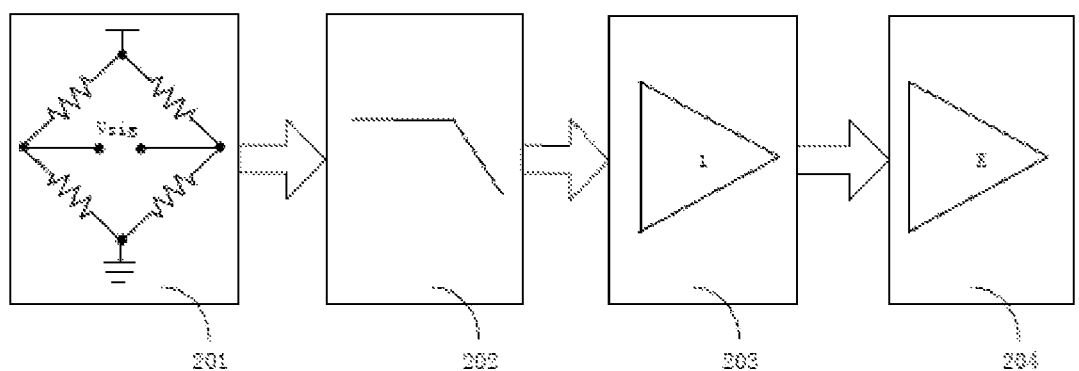
FIG. 2 is a schematic block diagram of an acceleration sensor control circuit according to an embodiment.

A sensor control circuit according to an embodiment is illustrated with reference to FIG. 2 through FIG. 6, hereinafter. As shown in FIG. 2, the sensor control circuit according to the embodiment includes a sensor 201, a filter circuit 202, a buffer circuit 203, and an amplifier circuit 204. An output end of the sensor 201 is connected to an input end of the filter circuit 202, an output end of the filter circuit 202 is connected to an input end of the buffer circuit 203, and an output end of the buffer circuit 203 is connected to an input end of the amplifier circuit 204. In FIG. 2, Vsig represents a signal input end of the sensor 201, K represents a magnification of the amplifier circuit 204.

In the present embodiment, the signal processing flow of the sensor control circuit (i.e. the signal processing flow of the sensor front end) is: the sensor 201 translates the acceleration into a varying voltage which is proportional to the acceleration; the voltage passes through the filter circuit (an anti-aliasing low frequency filter circuit, for example) 202, and passes through the buffer circuit 203 and is outputted to the post-stage magnifying circuit (a switched capacitor integrator circuit) 204 to be magnified. The sensor control circuit according to the embodiment is mainly employed to perform an amplifying process to the analog signal collected by the sensor. Circuits such as an analog to digital conversion circuit can be thereafter connected to the amplifier circuit 204 for subsequent processing.

In the embodiment, the sensor 201 can be an acceleration sensor; further, the sensor 201 is a piezo-resistive acceleration sensor. Of course, the sensor 201 can be sensors of other type besides the acceleration sensor, such as a temperature sensor, and a photosensitive sensor and so on, which is not limited herein.

Figure 3:
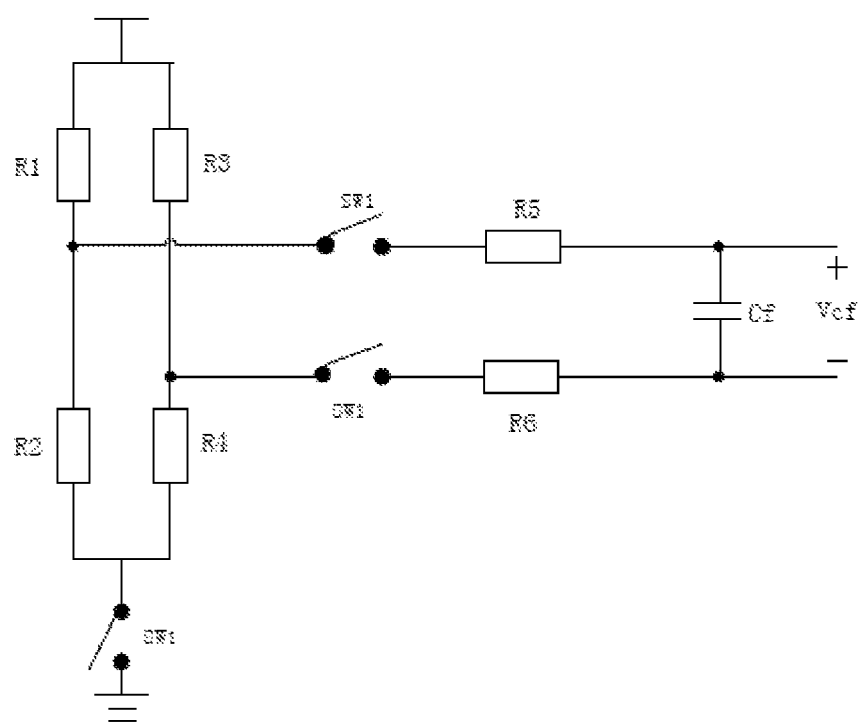
FIG. 3 is a circuit diagram of a sensor and a filter of the sensor control circuit of FIG. 2.

In one embodiment, the sensor 201 is a piezo-resistive acceleration sensor, the filter circuit 202 is an anti-aliasing low frequency filter. The overall circuit diagram of the sensor 201 and the filter circuit 202 is shown as FIG. 3. The sensor 201 (a piezo-resistive acceleration sensor) includes resistances R1, R2, R3, and R4, which forms a resistor bridge. The filter circuit 202 (an anti-aliasing low frequency filter) is a passive RC filter circuit, and includes resistances R5 and R6, and a capacitance Cf. The capacitance Cf is a filtering capacitance, the Vcf in FIG. 3 represents a voltage across the capacitance Cf. In addition, in the circuit forming the sensor 201 and the filter circuit 202, a pulse modulation switch configured to control the sensor 201 and the filter circuit 202 is further included. The on and off of the pulse modulation switch can be controlled by a periodic pulse signal which regulate and control the switch. The sensor 201 and the filter circuit 202 can intermittently work under a control of the pulse modulation switch. In one embodiment, as shown in FIG. 3, the modulation switch is constituted by 3 switches SW1 (the periodic pulse signal is not shown in the figure). With respect to the pulse modulation switch, various ways in the prior art can be adopted to accomplish, which is not limited herein.

Generally, the higher order active filter is constituted by an operational amplifier, many resistances and many capacitances, the circuit is complex, and a mismatch of the components can lead to a signal distortion. Further, the operational amplifier will consume a large amount of current. In the embodiment, a passive RC filter circuit is adopted, it avoids a distortion and further reduces power consumption, when compared to adopting an active filter circuit.

In the embodiment, one periodic pulse signal can be adopted by the pulse modulation switch to control the sensor 201 and the filter circuit 202 to work, i.e. the sensor 201 and the filter circuit 202 can work intermittently. A bandwidth of the continuous passive RC filter is $f=1/(2\pi*R*C)$. The embodiment adopts a periodic pulse signal to control the work of the sensor 201 and the filter circuit 202, not only reduce the power consumption (energy conservation), but also obtain a relative low bandwidth by using a resistance and a capacitance of the same magnitude (comparing to a continuous passive RC filter). In the embodiment, the duty ratio of the periodic pulse signal affects the actual bandwidth. When the duty ratio is lower, the resistance and capacitance employed to achieve a same bandwidth is less, the area and power consumption of the circuit is less.

Figure 4:
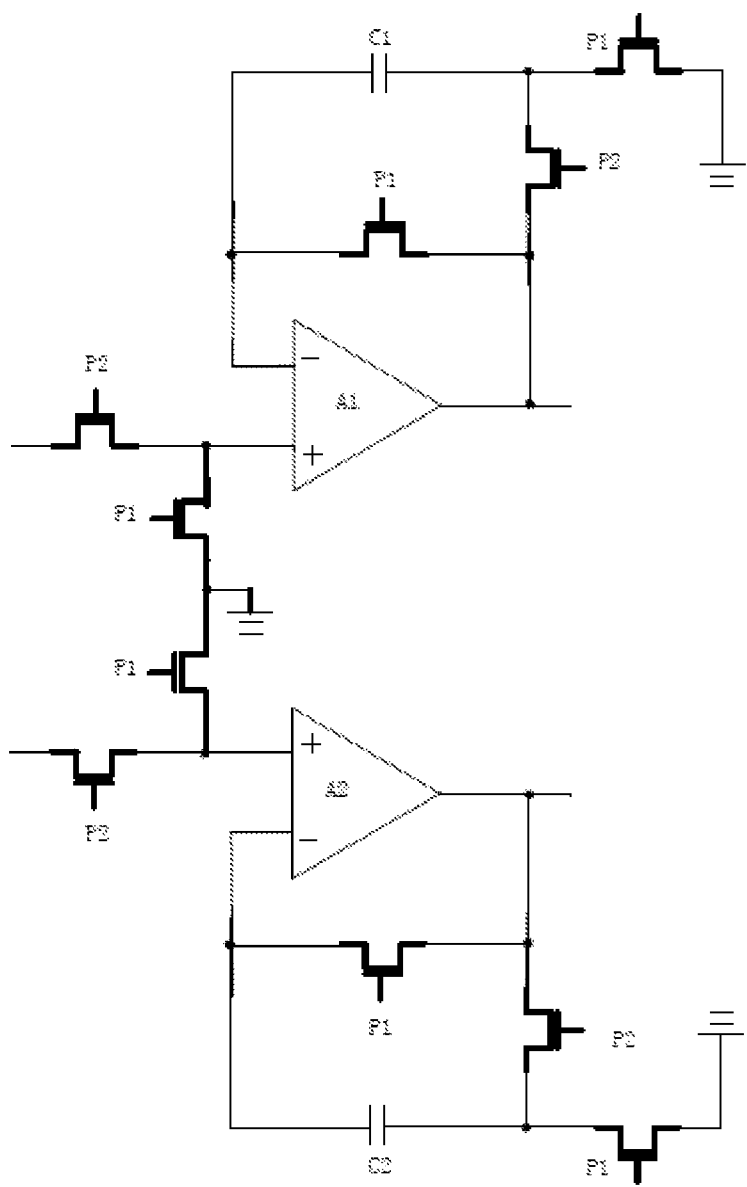
FIG. 4 is a circuit diagram of a buffer circuit of the sensor control circuit of FIG. 2.

In the embodiment, by virtue of providing the buffer circuit 203, the driving capability can be enhanced at some extent, ensuing a full sampling of the signal which is outputted by the filter circuit 202 by the post-stage amplifier circuit 204. Exemplary, the buffer circuit 203 adopts a buffer circuit with offset compensation. As shown in FIG. 4, the buffer circuit includes two amplifiers (the first amplifier A1 and the second amplifier A2), the two amplifiers are respectively connected in a form of a negative feedback to constitute a differential buffer circuit, as shown in FIG. 4. Because the output signal of the sensor 201 is a differential signal, therefore, two amplifiers are required to be respectively connected in the form of a negative feedback to form a differential buffer circuit.

Further, a first capacitance C1 is connected between a negative input end of the first amplifier A1 and an output end of the first amplifier A1. A second capacitance C2 is connected between a negative input end of the second amplifier A2 and an output end of the second amplifier A2. By virtue of such structure, the offset voltages of the two amplifiers (the first amplifier A1 and the first amplifier A2) are respectively sampled and stored in the two capacitances (C1 and C2), causing the output of the buffer circuit to be zero when the input signal is zero. The method of removing the offset voltage of the amplifier circuit is known as auto-zero technology. That is, the buffer circuit 203 is provided with an auto-zero structure. Generally, the offset voltage of the amplifier of the buffer circuit changes according to the voltage and the temperature, which is the main low frequency noise. It will be doped in the signal and amplified in the post-stage amplifier circuit (such as differential circuit) together with the signal, and finally reducing the effective signal in the output end, narrowing the dynamic range of the circuit and reducing the SNR. In the embodiment, the offset voltage in the amplifier circuit of the buffer circuit can be removed by adopting the auto-zero technology, and the SNR is improved. That is, the noise restraining capability is enhanced.

Specifically, the buffer circuit includes amplifiers A1 and A2, six transistors P1, four transistors P2, and two capacitances C1 and C2, the specific connection relationship is shown as FIG. 4.

In the embodiment, the parameters of the components are configured to enable the buffer circuit to have high input impedance and low output impedance. The high input impedance can reduce a charge leakage of the filtering capacitance Cf of the filter circuit 202, and keeps the voltage across the capacitance Cf unchanged. The low output impedance and the sampling capacitance of the post-stage amplifier circuit (an integrated circuit) can form a relative less time constant, ensuring the sampling capacitance of the amplifier circuit can be fully charged in one sampling period. That is to say, because the buffer circuit 203 provides high input impedance and low output impedance, it can ensure that the signal outputted by the filter circuit 202 can be fully sampled by the post-stage amplifier circuit 204.

Figure 5:
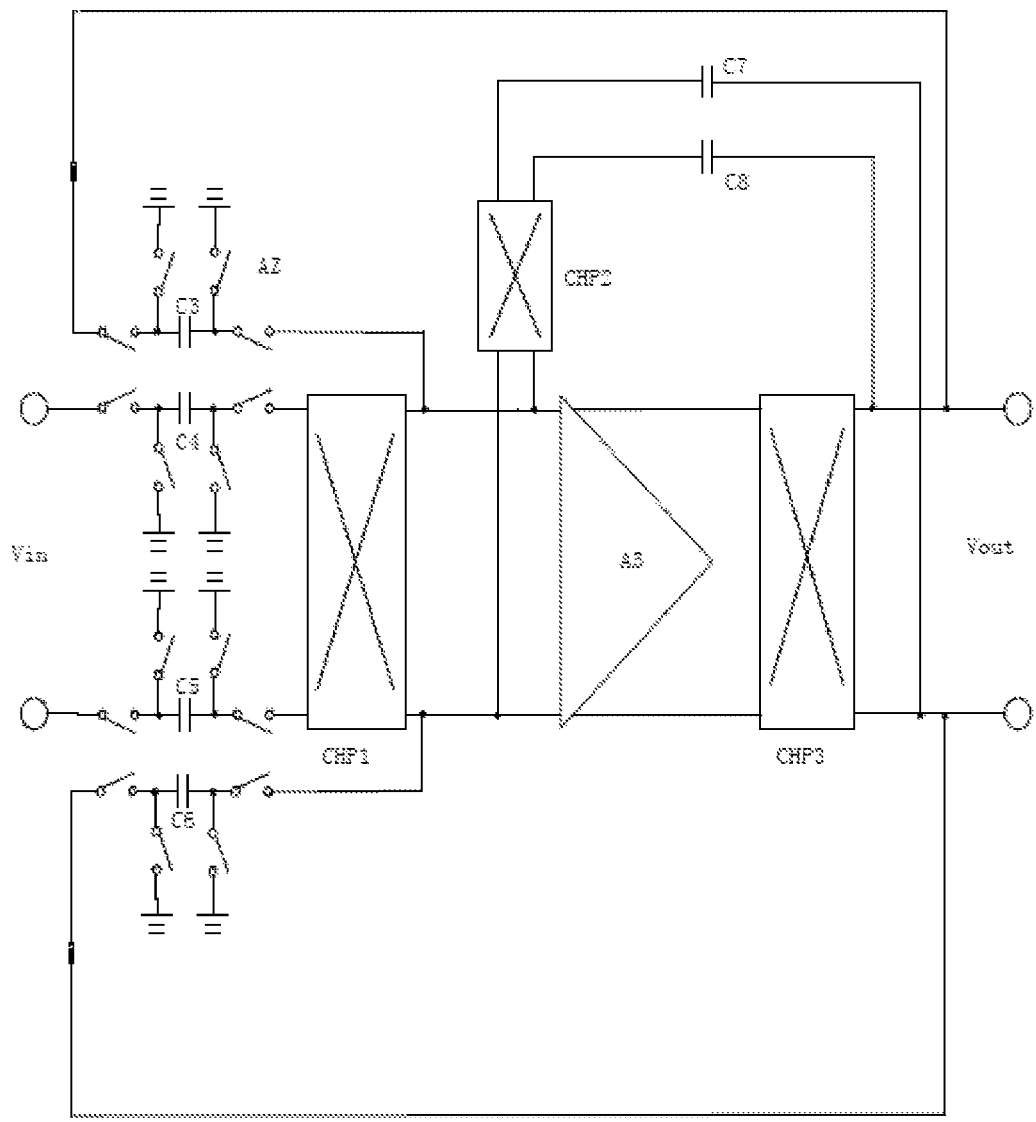
FIG. 5 is a circuit diagram of an amplifier circuit of the sensor control circuit of FIG. 2.
Figure 6:
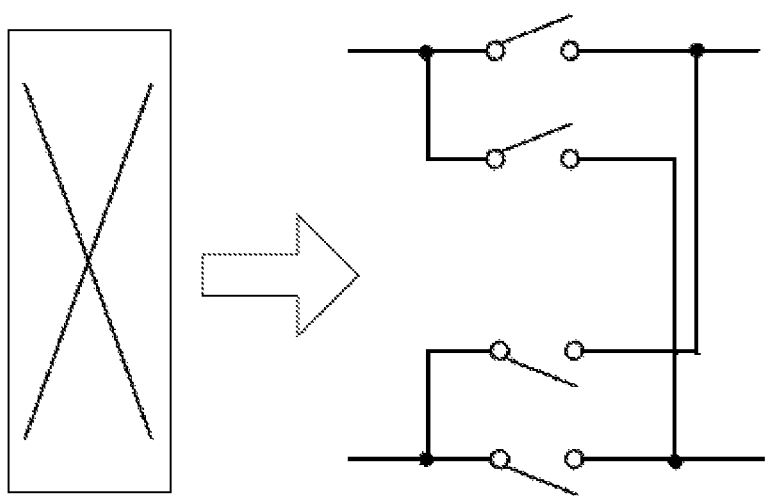
FIG. 6 is a circuit diagram of a chopper circuit of the circuit of FIG. 5.

Exemplary, the amplifier circuit 204 is shown as in FIG. 5, a gain controllable switched capacitor integrator circuit is adopted. The gain controllable switched capacitor integrator circuit adopts a full differential structure, as shown in FIG. 5, it includes one amplifier A3, several switches, six capacitances (i.e. C3, C4, C5, C6, C7 and C8), and three chopper circuits (i.e. CHP1, CHP2 and CHP3), the specific circuit configuration of the chopper circuit is shown as in FIG. 6. The gain controllable switched capacitor integrator circuit according the embodiment includes components and a connection relationship same as that shown in FIG. 5, Vin represents an input end, and Vout represents an output end.

Because the output signal of the sensor is relative low, it requires to be amplified, and then can be transferred to the A/D (analog/digital) conversion circuit to process. The traditional continuous amplifier realizes signal amplification by resistance, it demands a high requirement for the bandwidth and noise of the amplifier. At the same time, the offset voltage of the amplifier itself is difficult to be removed, and finally affecting the SNR of the system. However, in the embodiment, the amplifier circuit 204 is a gain controllable switched capacitor integrator circuit, the signal gain is determined by the capacitance ratio and the integration period. Because the accuracy of the capacitance ratio in the technology can generally reach 1% which is higher than a accuracy of the resistance ratio and the absolute accuracy of the resistance and the capacitance, and it is insensitive to a change of the voltage and the temperature, therefore, a higher accuracy signal gain can be obtained. In the embodiment, the magnification time of the signal can be changed by controlling the a clock period of the integrated circuit, when the period is constant, the magnification time is constant and cannot be influenced by a change of the technology, and will not change according to a change of the voltage and the temperature.

In the gain controllable switched capacitor integrator circuit according to the embodiment, the main amplifier A3 adopts a chopping technology, i.e. a chopper circuit CHP1 is introduced prior to the main amplifier A3, therefore, the low frequency noise (mainly the 1/f noise) in the circuit and the input offset voltage can be reduced. The chopping technology is a modulation technology, and configured to modulate the low frequency signal to a high frequency signal. Because the integrator itself is equivalent to a low-pass network, therefore, the noise signal which is modulated to a high frequency can be finally attenuated when it passes through the integrator (low-pass network).

In the embodiment, the integrated capacitance C8 does not adopt a chopping technology to increase a frequency of the chopping clock, it avoids a repeative charge and discharge to the capacitance C8 every time when the chopping is performed to the amplifier. According to Nyquist sampling theorem, the higher noise signal can be modulated by the higher chopping clock frequency, and finally will be removed by filtering.

In addition to adopt a chopping technique, the gain controllable switched capacitor integrator circuit according to the embodiment further adopts the auto-zero technology, i.e. the capacitance C7 is connected between an input end of the main amplifier A3 and an output end of the main amplifier A3 to sample the offset voltages of the amplifier A3 itself and stores the offset voltage in the sampling capacitance C7, causing the output of the buffer circuit to be zero when the input signal is zero. In the embodiment, by virtue of using the two technologies: chopping technology and auto-zero technology cooperatively, a target of completely removing the direct current offset voltage is finally reached. When a ratio between the input capacitance and the output capacitance is not 1:1, the chopping technology can be compensated by adjusting the auto-zero sampling capacitance C7.

The sensor control circuit according to the embodiment of the invention can improve a driving capability by virtue of providing a buffer circuit 203, and ensures a full sampling of the signal by the post-stage amplifier circuit 204, the signal is outputted by the filter circuit 202. The working hours of the sensor 201 and the filter circuit 202 (passive filter circuit) are controlled (i.e. the intermittently work of the sensor 201 and the filter circuit 202 are controlled by the pulse modulation switch), therefore, using a relative less resistance and capacitance under the condition of a same bandwidth can be achieved, thus the circuit area can be saved, and the power consumption can be reduced. By virtue of adopting auto-zero to the buffer circuit 203 itself, the offset voltage of the amplifier in the buffer circuit can be removed, the noise is reduced, and therefore reducing the difficulty of recovering the signal. By virtue of adopting the switched capacitor integrated circuit as the amplifier circuit 204, the magnification time can be easily controlled, at the same time, because the offset voltage in the amplifier of the amplifier circuit 204 is removed by adopting the chopping technology and the auto-zero technology, the noise can be reduced, the recovering difficulty of the signal can be reduced. Further, the magnification time is not influenced by the change of the voltage, the temperature, and the technology.

In summary, compared to the prior art, the sensor control circuit according to the embodiment of the invention has advantages such as full sampling, small circuit area, less power consumption, and strong noise suppression capability.

The embodiment of the invention further provides an electronic device which adopts above described sensor control circuit. Compared to the prior art, because the employed sensor control circuit has advantages such as small circuit area, less power consumption, and strong noise suppressing capability, therefore, the electronic device also has above described advantages, and can process a better performance.

The electronic device can be a mobile phone, a tablet computer, a notebook computer, a netbook, a game machine, a television, a VCD (video compact disc), a DVD (digital video disk), a navigator, a camera, a video camera, a recording pen, a MP3, a MP4, and any other electronic products or devices.

Although the invention is illustrated and described herein with reference to specific embodiments, the invention is not intended to be limited to the details shown. Rather, various modifications may be made in the details within the scope and range of equivalents of the claims and without departing from the invention. The scope of the invention is set forth in the following claims along with their full scope of equivalents.

What is claimed is:

1. A sensor control circuit, comprising:
   a sensor;
   a filter circuit;
   a buffer circuit; and
   an amplifier circuit;
   wherein an output end of the sensor is connected to an input end of the filter circuit, an output end of the filter circuit is connected to an input end of the buffer circuit, and an output end of the buffer circuit is connected to an input end of the amplifier circuit;
   wherein the filter circuit is an anti-aliasing low frequency filter under pulse modulation switch control,
   wherein a duty ratio of the pulse modulation switch control provides a particular bandwidth of the filter circuit using smaller resistors and capacitors than a passive anti-aliasing low frequency filter that lacks pulse modulation switch control.

2. The sensor control circuit according to claim 1, further comprising a pulse modulation switch configured to control the sensor and the filter circuit to work intermittently.

3. The sensor control circuit according to claim 1, wherein the buffer circuit is a differential buffer circuit with offset compensation, the buffer circuit comprises a first amplifier and a second amplifier, the first amplifier and the second amplifier are respectively connected in a form of a negative feedback.

4. The sensor control circuit according to claim 3, further comprising a first capacitance connected between a negative input end and an output end of the first amplifier, and a second capacitance connected between a negative input end and an output end of the second amplifier, wherein the first capacitance and the second capacitance form an auto-zero structure.

5. The sensor control circuit according to claim 1, wherein the buffer circuit has high input impedance and low output impedance, wherein the high input impedance reduces a charge leakage of the filter circuit, and the low output impedance contributes to ensuring that a sampling capacitance of an amplifier circuit can be fully charged in one sampling period.

6. The sensor control circuit according to claim 1, wherein the amplifier circuit is a gain controllable switched capacitor integrator circuit.

7. The sensor control circuit according to claim 6, wherein the switched capacitor integrator circuit comprises a main amplifier, a chopper circuit connected between an input end of the switched capacitor integrator circuit and an input end of the main amplifier, and/or a sampling capacitance connected between an input end of the main amplifier and an output end of the main amplifier; wherein the chopper circuit is configured to reduce a low frequency noise and an input offset voltage of the input end of the main amplifier; and the sampling capacitance forms an auto-zero structure to reduce the input offset voltage of the input end of the main amplifier.

8. The sensor control circuit according to claim 1, wherein the sensor is an acceleration sensor.

9. An electronic device, comprising a sensor control circuit, the sensor control circuit comprising:
   a sensor;
   a filter circuit;
   a buffer circuit; and
   an amplifier circuit;
   wherein an output end of the sensor is connected to an input end of the filter circuit, an output end of the filter circuit is connected to an input end of the buffer circuit, and an output end of the buffer circuit is connected to an input end of the amplifier circuit;
   wherein the filter circuit is an anti-aliasing low frequency filter under pulse modulation switch control,
   wherein a duty ratio of the pulse modulation switch control provides a particular bandwidth of the filter circuit using smaller resistors and capacitors than a passive anti-aliasing low frequency filter that lacks pulse modulation switch control.

10. The electronic device according to claim 9, further comprising a pulse modulation switch configured to control the sensor and the filter circuit to work intermittently.

11. The electronic device according to claim 9, wherein the buffer circuit is a differential buffer circuit with offset compensation, the buffer circuit comprises a first amplifier and a second amplifier, the first amplifier and the second amplifier are respectively connected in a form of a negative feedback.

12. The electronic device according to claim 11, further comprising a first capacitance connected between a negative input end and an output end of the first amplifier, and a second capacitance connected between a negative input end and an output end of the second amplifier, wherein the first capacitance and the second capacitance form an auto-zero structure.

13. The electronic device according to claim 9, wherein the buffer circuit has high input impedance and low output impedance, wherein the high input impedance reduces a charge leakage of the filter circuit, and the low output impedance contributes to ensuring that a sampling capacitance of an amplifier circuit can be fully charged in one sampling period.

14. The electronic device according to claim 9, wherein the amplifier circuit is a gain controllable switched capacitor integrator circuit.

15. The electronic device according to claim 14, wherein the switched capacitor integrator circuit comprises a main amplifier, a chopper circuit connected between an input end of the switched capacitor integrator circuit and an input end of the main amplifier, and/or a sampling capacitance connected between an input end of the main amplifier and an output end of the main amplifier; wherein the chopper circuit is configured to reduce a low frequency noise and an input offset voltage of the input end of the main amplifier; and the sampling capacitance forms an auto-zero structure to reduce the input offset voltage of the input end of the main amplifier.

16. The electronic device according to claim 9, wherein the sensor is an acceleration sensor.

\* \* \* \* \*